United States Patent [19]

Romania et al.

[11] 4,421,161
[45] Dec. 20, 1983

[54] HEAT EXCHANGER FOR INTEGRATED CIRCUIT PACKAGES

[75] Inventors: Samuel R. Romania, Phoenixville; Grant M. Smith, Bryn Athyn, both of Pa.

[73] Assignee: Burroughs Corporation, Detroit, Mich.

[21] Appl. No.: 375,491

[22] Filed: May 6, 1982

[51] Int. Cl.³ ............................................. F28F 7/00
[52] U.S. Cl. ...................... 165/80 C; 174/DIG. 12; 361/386; 361/388; 357/81; 165/185
[58] Field of Search ................... 165/10, 80 B, 80 C, 165/185; 174/DIG. 12; 361/386–389; 357/81

[56] References Cited

U.S. PATENT DOCUMENTS 3,325,582  6/1967  Ehrmann et al. ............ 165/DIG. 16
3,694,699  9/1972  Snyder et al. ...................... 165/185

OTHER PUBLICATIONS

IBM Technical Disclosure Bulletin, (vol. 20, No. 12), May 1978, (pp. 5142 & 5143).

*Primary Examiner*—William R. Cline
*Assistant Examiner*—Theophil W. Streule, Jr.
*Attorney, Agent, or Firm*—Francis A. Varallo; Edmund M. Chung; Kevin R. Peterson

[57] ABSTRACT

The present disclosure describes a heat exchange device for attachment to the external surface of a package containing an integrated circuit chip or die. The device has particular application in high density electronic packaging configurations, where space limitations severely curtail the volume which can be occupied thereby. The structure of the present device is such that both the effective cooling area per given volume and the heat transfer coefficient are maximized. Basically, the device is an integral structure comprised of a generally helical wire form affixed to a metallic frame-like member. The wire form provides a plurality of parallel closely spaced-apart cylindrical sections capable of being disposed in an air stream for dissipating the heat generated in the integrated circuit package to which the device is attached.

9 Claims, 3 Drawing Figures

HEAT EXCHANGER FOR INTEGRATED CIRCUIT PACKAGES

BACKGROUND OF THE INVENTION

An essential requirement for the operation of integrated circuits is the transfer of heat generated by the integrated circuit chip from the package itself to the external environment. The problem of heat dissipation is especially acute in high density packaging applications where the volume allotment for heat exchange media is extremely limited.

Commonly used heat exchange or heat sink devices for integrated circuit packages result from extrusions, stampings, and machined parts formed in a variety of shapes and configurations. However, because of size and volume constraints, none of these manufacturing methods yield devices which offer maximum effective cooling area for a given volume. The latter criterion is a prime factor in overall heat exchanger performance. Related to the effective cooling area of the device is its heat transfer coefficient factor. Here again, the above-mentioned devices do not maximize this characteristic. It is apparent that the heat that is transferred from the package to the ambient must overcome the thermal resistance of the heat exchanger itself. The largest component of the total resistance offered by the heat exchange device is designated film resistance and is inversely proportional to the surface area of the device. Stated another way, film resistance is the reciprocal of the product of the effective surface area and the convective heat transfer coefficient. Maximizing the latter factors, reduces the film resistance of the heat exchanger.

The present device accomplishes the foregoing with a simple, economical, volume effective structure.

SUMMARY OF THE INVENTION

In accordance with the present invention, a heat exchange device is provided for attachment to an integrated circuit chip carrier or package, for dissipating the heat generated by the chip during circuit operation. The heat exchange device of the present invention is comprised of two basic parts, namely, a wire form and a metallic frame-like retainer plate, which parts are assembled and bonded together to form an integral unit.

In an actual operative embodiment of the device, the wire form was constructed from a continuous length of wire formed into a helical coil with spaced-apart wraps or turns. Each turn resembles an open "T", with an upper turn portion joined by a pair of legs to a comparatively shorter lower turn portion, corresponding respectively to the horizontal top, vertical sides and horizontal base of the "T".

The retainer plate is a generally rectangular frame-like member having a plurality of spaced-apart cutouts or notches along the edges of two opposed sides of its central opening. The perimeter of the plate defines the approximate cross section of the volume allotted to the heat exchanger.

In assembly of the device, the wire form is inserted into the opening of the retainer plate. The aforementioned upper turn portions remain upright and rest upon the surface of the retainer plate, while the leg portions of the turns are accommodated by the cutouts. The lower turn portions serve as connecting members, joining a leg of one turn with the opposite leg of the next succeeding turn. The lower turn portions therefore exhibit a pitched configuration relative to the upper turn portions which are oriented in rectangular fashion in conformance with the shape of the retainer plate. The plate provides both the desired spacing for the coil turns and increased rigidity. The wire form and the retainer plate are then bonded together by any suitable method, such as reflow soldering, dip brazing or spot welding. As will be described in detail hereinafter, the retainer plate also serves to enhance the thermal effect of the wire form.

The heat exchanger of the present invention offers significant advantages over commonly employed heat exchange media. Thus, its low profile and minimal size make it useful in high density packaging applications. It provides maximum surface area and convective heat transfer coefficient for a given volume. Moreover, it provides minimum restriction to air flow in a forced air system, and is bidirectional with respect thereto. Also, it is easily attached to the integrated circuit package and imparts minimal thermal stress to the latter as a result of processing and other thermal excursions.

Other features and advantages of the heat exchanger of the present invention will become more apparent in the detailed description which follows:

DESCRIPTION OF THE PREFERRED EMBODIMENT

Figure 1:
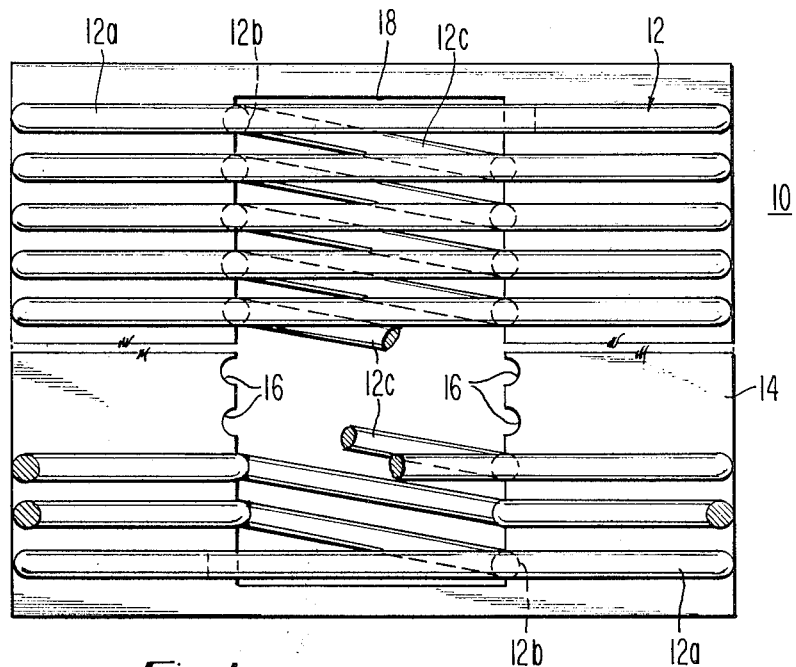
FIG. 1 is a plan view of the heat exchanger of the present invention.

Because of the close relationship of the figures, and the relative simplicity of the heat exchange device 10 of the present invention, specific reference should be made to FIG. 1, along with concurrent general reference to FIGS. 2 and 3 in the following description.

The device 10 is comprised of two parts, a wire form 12 and a retainer plate 14. In an actual operative embodiment, the wire form 12 was constructed of a continuous length of wire shaped into a coil having a plurality of spaced-apart turns. As seen particularly in FIG. 2, each turn of the coil exhibits a low-profile, open "T" configuration, wherein an upper turn portion 12a is joined by a pair of legs 12b to a comparatively shorter length lower turn portion 12c.

The retainer plate 14 is a rectangular, metallic, frame-like member having a plurality of homologous spaced-apart cutouts 16 along the respective edges of two opposed sides of its central opening 18. The perimeter of plate 14 defines the approximate cross section of the volume which may be occupied by the heat exchanger.

Figure 2:
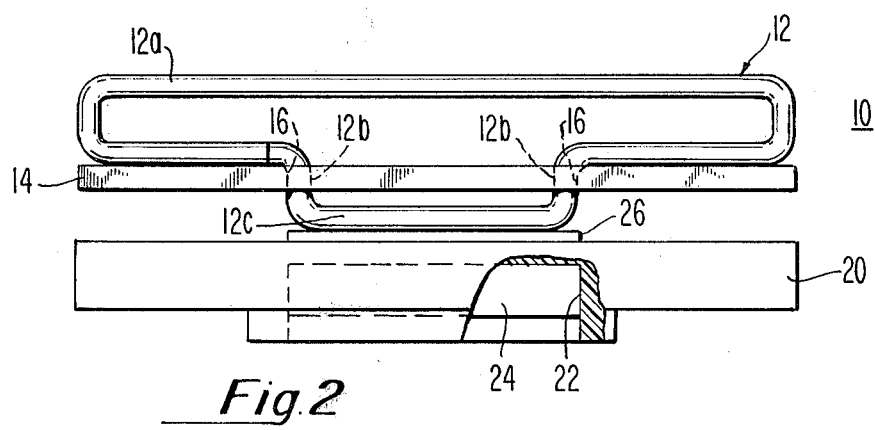
FIG. 2 is an end view of the heat exchanger of FIG. 1 shown attached to an integrated circuit package.
Figure 3:
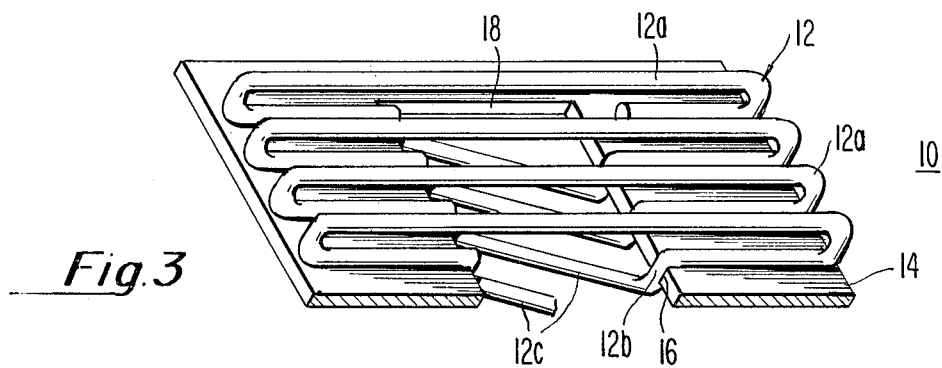
FIG. 3 is a pictorial view clearly illustrating a portion of the heat exchanger of FIG. 1.

As best seen in FIGS. 2 and 3, the heat exchange device 10 is assembled to the retainer plate 14 by maintaining the longitudinal axis of its wire form 12 parallel to the planar surface of plate 14 and inserting the lower turn portions 12c through the opening 18 of the latter. The upper turn portions 12a are now supported by the retainer plate 14 while the legs 12b are disposed in cutouts 16. It is apparent that the cutouts 16 help to maintain the spacing of the coils, one from the other. As seen particularly in FIGS. 1 and 3, the lower turn portions 12c serve as connecting members, each one joining a leg of one turn with the opposite leg of the next succeeding turn. Accordingly, the lower turn portions 12c exhibit a pitched configuration relative to the upper turn portions 12a. As seen in FIG. 2, the respective outermost surfaces of both the upper and lower turn portions 12a and 12c, are flattened in a planar (as opposed to an arcuate) shape. Accordingly, the last mentioned surfaces lie in respective planes parallel to that of the retainer plate 14. The wire form 12 and the retainer plate 14 are then bonded together by any suitable method, such as reflow soldering, dip brazing, or spot welding. The retainer plate 14 offers increased rigidity to the wire form 12.

FIG. 2 illustrates in simplified fashion, the heat exchange device 10 of the present invention attached to an integrated circuit package 20. The latter, commonly formed of ceramic, includes a cavity 22 within which the chip 24 is mounted. A metallized element 26 is shown bonded to the outer surface of the package 20. In practice the element 26 may be inlaid in the ceramic surface. In either case, the element 26 may extend across the entire surface of the package, or may be localized in the vicinity of the chip 24.

The heat exchange device 10 is attached to the metallized element 26. This is accomplished by bonding the lower turn portions 12c of the wire form 12 to the element 26 by soldering or the use of heat conductive adhesives. The heat generated by the chip 24 is conducted via the lower turn portions 12c and the legs 12b of the wire form 12 to the retainer plate 14 which tends to distribute the heat to all of the upper turn portions 12a, thereby improving the bulk conductions of the device 10. It has been found that while the heat exchange device 10 may interface with a large metallization field, it induces minimal thernal stress on the package as a result of processing and temperature excursions.

The heat exchange device 10 of the present invention is especially suitable for forced air cooling—the upper turn portions 12a of the wire form 12 offering minimal resistance to air flow. It should be noted that as air passes over a heat exchanger with substantially flat surfaces, such as the known devices which are extruded, stamped or machined, a boundary layer adjacent the heat exchange surface is produced which affects the degree of heat dissipation. In contrast, the upper turn portions 12a of the wire form 12 of the present device appear as a multiplicity of parallel spaced-apart cylindrical members. Although the present device is bidirectional with respect to the direction of air flow, optimum results occur when the air stream is parallel to the coil axis of the wire form 12. This is true because air flow directed across members of circular cross section, cause a turbulent effect on the back side of each of the members, thereby improving the conditions for heat transfer. In effect, the turbulence breaks up the boundary layer effect noted hereinbefore, and increases the convective heat transfer coefficient.

In conclusion, it is submitted that the heat exchanger disclosed herein offers a low-cost, simple, highly efficient means of heat dissipation in a high density integrated circuit package configuration. The inventive concepts described herein are generic to various applications. In an actual operative situation, copper wire having a diameter of 0.042 inches was used for the wire form, while the copper retainer plate was 0.80 inches square and had a thickness of 0.032 inches. The overall height of the heat exchanger was 0.27 inches. It should be understood that in other applications, changes and modifications of the foregoing parameters may be needed to suit particular requirements. Such variations are within the skill of the designer, and do not depart from the true scope and spirit of the invention and are intended to be covered by the following claims:

What is claimed is:

1. A heat exchange device for an integrated circuit package comprising:
    a wire form having a plurality of spaced-apart turns, each of said turns exhibiting an open T-shaped configuration wherein an upper turn portion of predetermined length is joined by a pair of opposed legs to a comparatively shorter length lower turn portion,
    a retainer plate configured as a frame-like member with a central opening,
    said wire form being disposed within said central opening such that the upper and lower turn portions of said turns extend outward from the respective opposite planar surfaces of said retainer plate, the legs of each of said turns contacting the edges of said retainer plate adjacent said central opening,
    said wire form being affixed to said retainer plate to produce an integral unit.

2. A heat exchange device as defined in claim 1 wherein said wire form is a continuous length of wire shaped into a helical coil.

3. A heat exchange device as defined in claim 2 wherein said retainer plate is a substantially planar rectangular member.

4. A heat exchange device as defined in claim 3 wherein said legs of each of said turns contact the edges of two opposite sides of said retainer plate adjacent said central opening, said edges including respective pluralities of homologous spaced-apart cutouts for receiving the legs of said turns, said cutouts establishing the spacing between said turns.

5. A heat exchange device as defined in claim 4 wherein each of said lower turn portions connects a leg of a given turn with the opposite leg of the next succeeding turn.

6. A heat exchange device as defined in claim 5 wherein said lower turn portions of said wire form exhibit a pitched configuration relative to said upper turn portions, the latter conforming substantially to the shape of said retainer plate, said lower turn portions being adapted to be attached to the surface of said integrated circuit package during the operation thereof.

7. A heat exchange device as defined in claim 6 further characterized in that said upper turn portions of said wire form appear as a plurality of parallel spaced-apart cylindrical members to an air stream in which said device is operationally disposed.

8. A heat exchange device as defined in claim 7 further characterized in that the respective outermost surfaces of both said upper and lower turn portions of said wire form lie in respectivel parallel planes relative to the planar surfaces of said retainer plate.

9. A heat exchange device as defined in claim 8 wherein said wire form and said retainer plate are both formed of copper.

* * * * *